US012588446B2

(12) United States Patent
Terui et al.

(10) Patent No.: US 12,588,446 B2
(45) Date of Patent: Mar. 24, 2026

(54) SURFACE TREATMENT COMPOSITION AND METHOD FOR PRODUCING WAFER

(71) Applicant: CENTRAL GLASS COMPANY, LIMITED, Ube (JP)

(72) Inventors: Yoshiharu Terui, Tokyo (JP); Yuzo Okumura, Tokyo (JP); Soichi Kumon, Tokyo (JP)

(73) Assignee: CENTRAL GLASS COMPANY, LIMITED, Ube (JP)

( * ) Notice: Subject to any disclaimer, the term of this patent is extended or adjusted under 35 U.S.C. 154(b) by 383 days.

(21) Appl. No.: 18/254,346

(22) PCT Filed: Feb. 21, 2022

(86) PCT No.: PCT/JP2022/006900
§ 371 (c)(1),
(2) Date: May 24, 2023

(87) PCT Pub. No.: WO2022/181530
PCT Pub. Date: Sep. 1, 2022

(65) Prior Publication Data
US 2024/0038540 A1 Feb. 1, 2024

(30) Foreign Application Priority Data
Feb. 26, 2021 (JP) ................................. 2021-029887

(51) Int. Cl.
*H01L 21/306* (2006.01)
*C23C 16/02* (2006.01)
(Continued)

(52) U.S. Cl.
CPC ........ *H01L 21/306* (2013.01); *C23C 16/0227* (2013.01); *C23C 16/44* (2013.01); *C23C 16/56* (2013.01)

(58) Field of Classification Search
CPC . H01L 21/02; H01L 21/02057; H01L 21/304; H01L 21/306; H01L 21/31;
(Continued)

(56) References Cited

U.S. PATENT DOCUMENTS

| | | | |
|---|---|---|---|
| 8,828,144 B2 | 9/2014 | Kumon et al. | |
| 10,093,815 B2 * | 10/2018 | Mori ..................... | H01L 21/306 |

(Continued)

FOREIGN PATENT DOCUMENTS

| | | |
|---|---|---|
| JP | 2013-118347 | 6/2013 |
| JP | 2018-182112 A | 11/2018 |

(Continued)

OTHER PUBLICATIONS

Office Action issued in corresponding Korean Patent Application No. 10-2023-7017691, Jun. 21, 2024, 5 pages.
(Continued)

*Primary Examiner* — Brook Kebede
(74) *Attorney, Agent, or Firm* — HSML P.C.

(57) ABSTRACT

A surface treatment composition of the present invention is a surface treatment composition that are supplied as a vapor to a surface of a wafer having an uneven pattern on the surface and used to form a water-repellent protective film on the surface, the surface treatment composition containing a silylating agent and a solvent, in which the silylating agent contains a trialkylsilylamine, the solvent contains at least one or more selected from the group consisting of glycol ether acetate and glycol acetate, and a total content of the glycol ether acetate and the glycol acetate is 50% by mass or more in 100% by mass of a total amount of the solvent.

19 Claims, 2 Drawing Sheets

(51) Int. Cl.
  *C23C 16/44*    (2006.01)
  *C23C 16/56*    (2006.01)

(58) Field of Classification Search
  CPC ..... C23C 16/02; C23C 16/0227; C23C 16/44;
     C23C 16/56; C07F 7/02; C07F 7/10;
     C09D 5/1612; C09D 5/16; C09K 3/18
  See application file for complete search history.

(56)       References Cited

U.S. PATENT DOCUMENTS

| | | | | |
|---|---|---|---|---|
| 2012/0017934 | A1* | 1/2012 | Kumon | B08B 3/10 |
| | | | | 134/1.1 |
| 2012/0164818 | A1 | 6/2012 | Kumon et al. | |
| 2012/0174945 | A1* | 7/2012 | Saio | H01L 21/02068 |
| | | | | 134/4 |
| 2012/0211025 | A1 | 8/2012 | Kumon et al. | |
| 2014/0311379 | A1 | 10/2014 | Ryokawa et al. | |
| 2017/0088722 | A1 | 3/2017 | Mori et al. | |
| 2021/0009882 | A1 | 1/2021 | Terui | |

FOREIGN PATENT DOCUMENTS

| | | |
|---|---|---|
| JP | 2020-038333 | 3/2020 |
| KR | 10-2017-0065689 | 6/2017 |
| WO | 2012/002346 A1 | 1/2012 |
| WO | 2019/193967 | 10/2019 |

OTHER PUBLICATIONS

Extended European Search Report, issued in the corresponding European patent application No. 22759566.7, dated Mar. 12, 2025.
International Search Report of PCT/JP2022/006900, May 17, 2022, 2 pages.
Taiwanese Notice of Allowance, issued in the corresponding Taiwanese patent application No. 111107114, dated Sep. 4, 2025, 4 pages.
Japanese Notice of Allowance, issued in the corresponding Japanese patent application No. 2023-502380, dated Jan. 6, 2026, 1 page.

\* cited by examiner

[Fig.1]
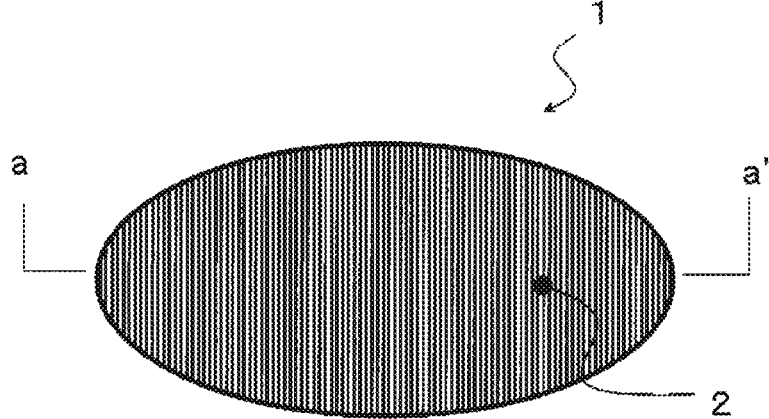
[Fig.2]
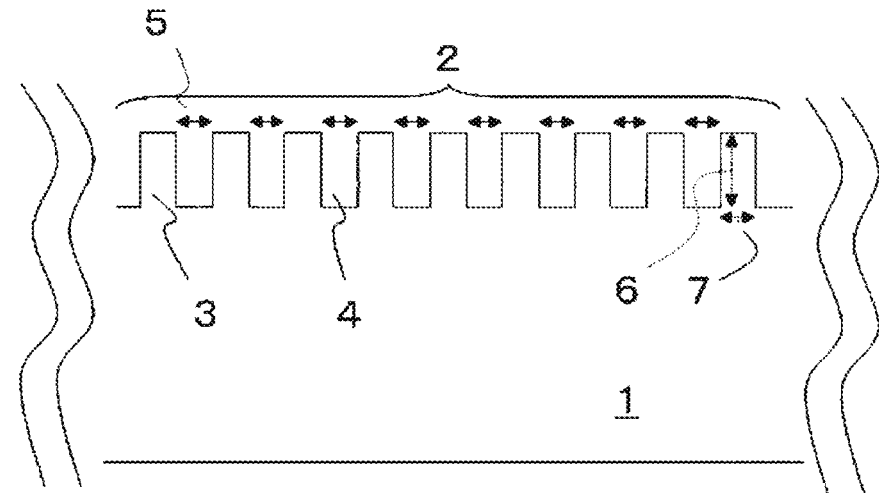

[Fig.3]
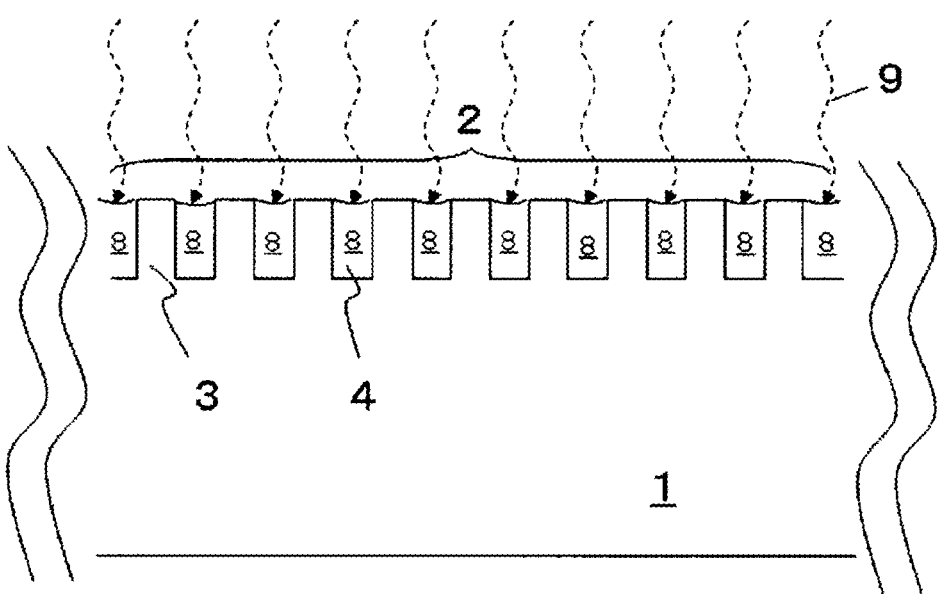
[Fig.4]
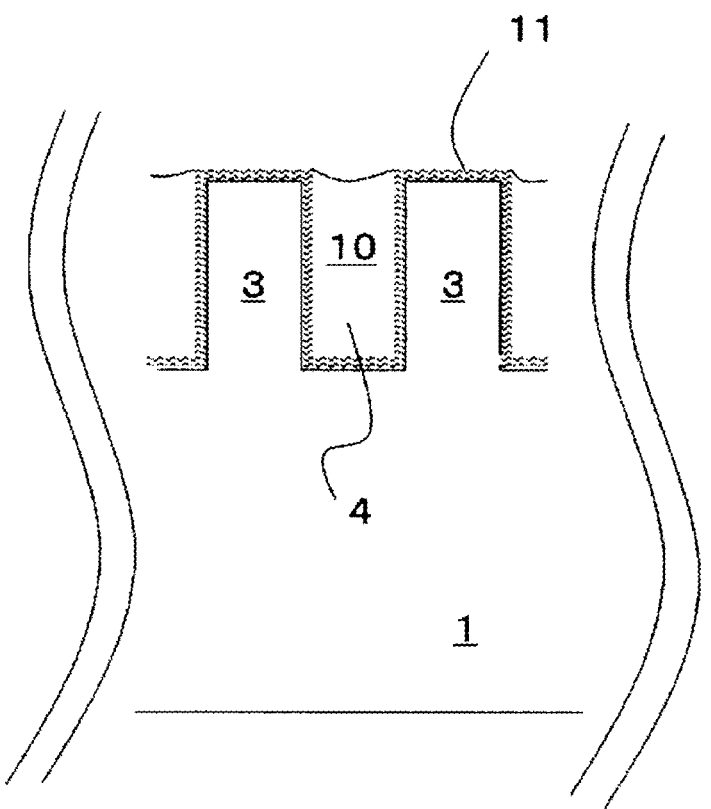

SURFACE TREATMENT COMPOSITION AND METHOD FOR PRODUCING WAFER

TECHNICAL FIELD

The present invention relates to a surface treatment composition and a method for producing a wafer.

BACKGROUND ART

Semiconductor devices for networks or digital consumer electronics are required to have higher performance, higher function, and lower power consumption. Therefore, circuit pattern miniaturization is in progress, and the progress of the miniaturization creates a problem of pattern collapse in circuit patterns. In the producing of semiconductor devices, a cleaning step is frequently used for the purpose of removing particles or metal impurities, and, as a result, the cleaning step accounts for up to 30% to 40% of all semiconductor producing steps. In this cleaning step, if the aspect ratio of a pattern increases in association with the miniaturization of semiconductor devices, the pattern collapses when the gas-liquid interface passes through the pattern after cleaning or rinsing, and this phenomenon is pattern collapse. In order to prevent the occurrence of pattern collapse, there is no other option but to change the design of patterns or a decrease in production yield is caused, and thus there is a desire for a method for preventing pattern collapse in cleaning steps.

As a method for preventing pattern collapse, it is known that the formation of a water-repellent protective film on the pattern surface is effective. Since there is a need to make the pattern surface water-repellent without drying the pattern surface, a water-repellent protective film is formed by supplying a chemical solution for forming a water-repellent protective film capable of making the pattern surface water-repellent to the pattern surface in a state of holding a cleaning liquid or the like to replacing the cleaning liquid or the like with the chemical solution.

As this type of technique, for example, a technique described in Patent Document 1 is known. Patent Document 1 describes a surface treatment composition containing a silylating agent, diethyl carbonate and propylene carbonate as solvents (Example 5 of Patent Document 1 or the like).

RELATED DOCUMENT

Patent Document

Patent Document 1: International Publication No. WO 2019/193967

SUMMARY OF THE INVENTION

Technical Problem

However, as a result of the present inventors' studies, it has been clarified that there is a room for improvement in surface modification capability and storage stability in the surface treatment composition described in Patent Document 1.

Solution to Problem

As a result of additional studies, the present inventors found that, when a trialkylsilylamine as a silylating agent and glycol ether acetate and/or glycol acetate as solvents are used and the total content thereof is set to a predetermined amount or more, it is possible to improve surface modification capability and storage stability in surface treatment compositions and completed the present invention.

According to the present invention, provided is a surface treatment composition that are supplied as a vapor to a surface of a wafer having an uneven pattern on the surface and used to form a water-repellent protective film on the surface, the surface treatment composition containing a silylating agent and a solvent, in which the silylating agent contains a trialkylsilylamine, the solvent contains at least one or more selected from the group consisting of glycol ether acetate and glycol acetate, and a total content of the glycol ether acetate and the glycol acetate is 50% by mass or more in 100% by mass of a total amount of the solvent.

In addition, according to the present invention, provided is a method for producing a wafer, including a step of preparing a wafer having an uneven pattern on a surface, a step of cleaning the surface of the wafer by supplying a cleaning liquid, and a step of supplying a vapor of a surface treatment composition to the surface on which the cleaning liquid is held, changing, on the surface, a state of the vapor to a liquid to replace the cleaning liquid with the liquid, and forming a water-repellent protective film on at least a part of the surface, in which the surface treatment composition contains a silylating agent and a solvent, the silylating agent contains a trialkylsilylamine, the solvent contains at least one or more selected from the group consisting of glycol ether acetate and glycol acetate, and a total content of the glycol ether acetate and the glycol acetate is 50% by mass or more in 100% by mass of a total amount of the solvent.

Advantageous Effects of Invention

According to the present invention, a surface treatment composition being excellent in terms of surface modification capability and storage stability and a method for producing a wafer using the same are provided.

BRIEF DESCRIPTION OF THE DRAWINGS

FIG. 1 is a schematic perspective view of a wafer having a fine uneven pattern on a surface.

FIG. 2 is a schematic cross-sectional view showing a part of an a-a' cross section in FIG. 1.

FIG. 3 is a schematic cross-sectional view of a state in which a vapor of a composition is supplied to recesses holding a liquid.

FIG. 4 is a schematic cross-sectional view of a wafer on which a water-repellent protective film is formed.

DESCRIPTION OF EMBODIMENTS

Hereinafter, an embodiment of the present invention will be described using drawings. In all of the drawings, the same configuration elements will be given the same reference sign and will not be repeated. In addition, the drawings are schematic views and do not match actual dimensional ratios.

The outline of a surface treatment composition of the present embodiment will be described.

The surface treatment composition of the present embodiment is a surface treatment composition that is supplied as a vapor to the surface of a wafer having an uneven pattern on the surface and is used to form a water-repellent protective film on the surface.

This surface treatment composition contains a silylating agent and a solvent, the silylating agent contains a trialkylsilylamine, the solvent contains at least one or more selected from the group consisting of glycol ether acetate and glycol acetate, and the total content of glycol ether acetate and glycol acetate becomes 50% by mass or more in 100% by mass of the total amount of the solvent.

When the surface treatment composition of the present embodiment is used and applied to the producing of a wafer having an uneven pattern on the surface, it is possible to suppress the pattern collapse of the uneven pattern.

Here, the producing of a semiconductor wafer will be described as an example.

In the producing process of the semiconductor wafer, a fine uneven pattern is formed on a substrate (wafer) surface through film formation, lithography, etching, or the like, then, a wet-type treatment such as a cleaning step where water or an organic solvent is used is performed to clean the wafer surface, and a drying step is also performed to remove a liquid such as a cleaning liquid or a rinsing liquid attached to the wafer due to the wet-type treatment.

It is known that, during such a drying step, the deformation or collapse of the uneven pattern is likely to occur on the wafer having a fine uneven pattern.

When a water-repellent protective film is formed on the uneven pattern using the vapor of the surface treatment composition and the surface is modified so that the wafer surface exhibits water repellency, it becomes possible to suppress the deformation or collapse of the uneven pattern during the drying step. This makes it possible to realize a wafer producing method being excellent in terms of producing stability.

According to the present inventors' findings, it was clarified that, when a trialkylsilylamine as a silylating agent and glycol ether acetate and/or glycol acetate as a solvent are jointly used and then the total content of glycol ether acetate and the glycol acetate is set to 50% by mass or more in 100% by mass of the total amount of the solvent, it is possible to improve surface modification capability and storage stability.

Although the detailed mechanism is not clear, it is considered that the use of glycol ether acetate and/or glycol acetate, which are solvents that do not easily react with the trialkylsilylamine, which is the silylating agent, as the main components of the solvent suppresses reactions in liquid, makes it possible to improve the storage stability, and also suppresses reactions in gas (vapor), and thus makes it possible to suppress the deterioration of the surface modification capability.

In addition, it is considered that, since the solvent having a high boiling point (low volatility) preferentially agglomerates on the wafer surface and replaces the cleaning liquid, it is possible to suppress the silylating agent reacting with the cleaning liquid and being consumed, and thus the deterioration of the surface modification capability can be suppressed.

Hereinafter, the configuration of the surface treatment composition of the present embodiment will be described in detail.

(Silylating Agent)

The surface treatment composition contains one or more trialkylsilylamines as a silylating agent.

A trialkylsilylamine is a silane compound having at least a structure in which three alkyl groups and one amino group bond to a Si atom.

The alkyl groups are groups selected from hydrocarbon groups having 1 to 10 carbon atoms and hydrocarbon groups having 1 to 10 carbon atoms in which some or all of the hydrogen atoms are replaced with fluorine atoms.

Examples of the amino group include monovalent groups obtained by removing hydrogen from primary amines or secondary amines, and, for example, $-NH_2$, a dialkylamino group ($-N(CH_3)_2$, $-N(C_2H_5)_2$, or the like), a t-butylamino group, an allylamino group, $-NHSi(CH_3)_3$, $-NH-C$ ($=O)-Si(CH_3)_3$, $-NHC(=O)CH_3$, $-NHC(=O)CF_3$, $-N(CH_3)C(=O)CH_3$, $-N(CH_3)C(=O)CF_3$, $-NHC$ ($=O)-OSi(CH_3)_3$, $-NHC(=O)-NH-Si(CH_3)_3$ (for example, N,N'-bis(trimethylsilyl)urea or the like), a group having a ring containing nitrogen (provided that a nitrogen atom configuring the ring bonds to the above-described Si atom) or the like may be used. Examples of the ring containing nitrogen include a piperidine ring, an imidazole ring (for example, N-trimethylsilylimidazole or the like), a triazole ring (for example, N-trimethylsilyltriazole or the like), a tetrazole ring, an oxazolidinone ring, a morpholine ring, other nitrogen-containing heterocycles, and the like.

Specific examples of the trialkylsilylamine include trimethylsilylamines such as trimethylsilyldimethylamine, trimethylsilyldiethylamine, N-(trimethylsilyl)-tertiarybutylamine, hexamethyldisilazane, trimethylsilylpiperidine, and N-(trimethylsilyl)-imidazole, compounds in which a trimethylsilyl group in the trimethylsilylamines is an ethyldimethylsilyl group, compounds in which the trimethylsilyl group is a propyldimethylsilyl group, compounds in which the trimethylsilyl group is a butyldimethylsilyl group, compounds in which the trimethylsilyl group is a hexyldimethylsilyl group, compounds in which the trimethylsilyl group is an octyldimethylsilyl group, compounds in which the trimethylsilyl group is a decyldimethylsilyl group, and the like. These may be used singly or two or more trialkylsilylamines may be used in combination.

Among these, from the viewpoint of a difficulty of the deactivation of the silylating agent when vaporized (vapor stability), trimethylsilyldimethylamine, trimethylsilyldiethylamine, N-(trimethylsilyl)-tertiarybutylamine, hexamethyldisilazane, compounds in which a trimethylsilyl group in the trimethylsilylamines is an ethyldimethylsilyl group, compounds in which the trimethylsilyl group is a propyldimethylsilyl group, compounds in which the trimethylsilyl group is a butyldimethylsilyl group, compounds in which the trimethylsilyl group is a hexyldimethylsilyl group, compounds in which the trimethylsilyl group is an octyldimethylsilyl group, and compounds in which the trimethylsilyl group is a decyldimethylsilyl group are preferable. In addition, from the viewpoint of silylation reactivity, trimethylsilyldimethylamine, trimethylsilyldiethylamine, and N-(trimethylsilyl)-tertiary-butylamine are preferable.

The lower limit of the content of the silylating agent is, for example, 0.3% by mass or more, preferably 3% by mass or more, and more preferably 9% by mass or more in 100% by mass of the surface treatment composition. In such a case, the surface modification capability can be improved.

On the other hand, the upper limit of the content of the silylating agent is, for example, 30% by mass or less, preferably 25% by mass or less, and more preferably 20% by mass or less in 100% by mass of the surface treatment composition. In such a case, the storage stability can be improved.

The lower limit of the content of the trialkylsilylamine is, for example, 50% by mass or more, preferably 70% by mass or more, and more preferably 80% by mass or more in 100% by mass of the silylating agent. In such a case, the surface modification capability and the storage stability can be improved.

On the other hand, the upper limit of the content of the trialkylsilylamine in 100% by mass of the silylating agent is not particularly limited, but may be 100% by mass or less or 98% by mass or less in a case where a plurality of silylating agents are jointly used.

(Solvent)

The surface treatment composition contains one or more of glycol ether acetate and/or glycol acetate as the solvent. In a case where two or more are contained, as the content of glycol ether acetate and/or glycol acetate in the solvent, the total amount of glycol ether acetate and glycol acetate that are contained in the solvent is used.

Specific examples of glycol ether acetate and glycol acetate include ethylene glycol monomethyl ether acetate, ethylene glycol monoethyl ether acetate, ethylene glycol monobutyl ether acetate, ethylene glycol diacetate, diethylene glycol monomethyl ether acetate, diethylene glycol monoethyl ether acetate, diethylene glycol monobutyl ether acetate, diethylene glycol diacetate, triethylene glycol monomethyl ether acetate, triethylene glycol monoethyl ether acetate, triethylene glycol monobutyl ether acetate, triethylene glycol diacetate, tetraethylene glycol monomethyl ether acetate, tetraethylene glycol monoethyl ether acetate, tetraethylene glycol monobutyl ether acetate, tetraethylene glycol diacetate, propylene glycol monomethyl ether acetate, propylene glycol monoethyl ether acetate, propylene glycol monobutyl ether acetate, propylene glycol diacetate, dipropylene glycol monomethyl ether acetate, dipropylene glycol monoethyl ether acetate, dipropylene glycol monobutyl ether acetate, dipropylene glycol diacetate, tripropylene glycol monomethyl ether acetate, tripropylene glycol monoethyl ether acetate, tripropylene glycol monobutyl ether acetate, tripropylene glycol diacetate, tetrapropylene glycol monomethyl ether acetate, tetrapropylene glycol diacetate, butylene glycol monomethyl ether acetate, butylene glycol diacetate, glycerin triacetate, 3-methoxybutyl acetate, 3-methyl-3-methoxybutyl acetate, and the like. These may be used singly or two or more trialkylsilylamines may be used in combination.

Among these, glycol ether acetate is more preferable than glycol acetate because glycol ether acetate has a lower boiling point and thus easily vaporizes, and propylene glycol monomethyl ether acetate is more preferable from the viewpoint of storage stability.

The total content of at least one solvent selected from the group consisting of glycol ether acetate and glycol acetate is 50% by mass or more, preferably 70% by mass or more, and more preferably 80% by mass or more in 100% by mass of the total amount of the solvent. In such a case, the storage stability can be improved.

On the other hand, the total content of the solvent selected from glycol ether acetate and glycol acetate in 100% by mass of the total amount of the solvent may be 100% by mass or less and may be 98% by mass or less in a case where a plurality of solvents is jointly used. In addition, substantially 100% by mass of the solvent may be at least one selected from the group consisting of glycol ether acetate and glycol acetate. "Substantially 100% by mass" means that there are no other solvents intentionally mixed as solvents.

The lower limit of the total content of glycol ether acetate and glycol acetate is, for example, 50% by mass or more, preferably 70% by mass or more, and more preferably 80% by mass or more in 100% by mass of the surface treatment composition. In such a case, the storage stability can be improved.

On the other hand, the upper limit of the substantial total content of glycol ether acetate and glycol acetate is, for example, 99% by mass or less, preferably 97% by mass or less, more preferably 95% by mass or less, and still more preferably 92% by mass or less in 100% by mass of the surface treatment composition. In such a case, it is possible to achieve a balance between the surface modification capability and other characteristics.

(Surface Treatment Composition)

In addition, as an example of the present embodiment, the total content of the trialkylsilylamine and at least one or more selected from the group consisting of glycol ether acetate and glycol acetate is, for example, 60% by mass or more, preferably 80% by mass or more, and more preferably 95% by mass or more in 100% by mass of the surface treatment composition. In such a case, the surface modification capability and the storage stability can be improved.

In addition, another example of the surface treatment composition may be a surface treatment composition composed of a silylating agent and at least one or more selected from the group consisting of glycol ether acetate and glycol acetate or may be preferably a surface treatment composition composed of a trialkylsilylamine and at least one or more selected from the group consisting of glycol ether acetate and glycol acetate.

In addition, in the surface treatment composition, the boiling point difference between the boiling point of the solvent and the boiling point of the silylating agent at 1 atm (the boiling point of the solvent—the boiling point of the silylating agent) is, for example, 20° C. or more, preferably 40° C. or more and more preferably 55° C. or more. In such a case, the solvent having a high boiling point preferentially agglomerates on the wafer surface and replaces the cleaning liquid, and thus it is possible to suppress the silylating agent being deactivated due to the contact with the cleaning liquid and to suppress the deterioration of the surface modification capability. In addition, the boiling point of the solvent needs to be low enough to prevent the silylating agent from being thermally decomposed when vaporized, and the boiling point difference is not particularly limited. The above-described boiling point difference may be, for example, 200° C. or less and may be preferably 150° C. or less.

In a case where a plurality of solvents and a plurality of silylating agents are contained, as the boiling point of each of the solvents and the silylating agents, the boiling point of a component having the largest content rate (% by mass) among components that are contained in the solvents or the silylating agents is adopted (here, in a case where two or more components have the largest content rate, the boiling point of a component having a highest temperature is adopted).

In the surface treatment composition, the content of water is preferably small and particularly preferably substantially zero.

The surface treatment composition of the present embodiment may contain different components other than the above-described components to an extent that the object of the present invention is not impaired. Examples of these different components include a silylating agent other than the trialkylsilylamine, a solvent other than glycol ether acetate and glycol acetate, a surfactant, an antioxidant such as dibutylhydroxytoluene (BHT), and the like.

The surface treatment composition does not contain any fluorine-based solvents, but may be configured to contain a fluorine-based solvent in a content of 2% by mass or less in 100% by mass of the surface treatment composition. When the solvent is made to substantially not contain any fluorine-based solvents, it is possible to improve the agglomerating property of the vapor of the surface treatment composition in the in-plane direction on the wafer surface. Examples of the fluorine-based solvent include hydrofluorocarbons, hydrofluoroethers, perfluorocarbons, hydrochlorofluorocarbons, and the like.

The surface treatment composition does not contain any acyclic carbonate esters, but may be configured to contain an acyclic carbonate ester in a content of 2% by mass or less in 100% by mass of the surface treatment composition. When the solvent is made to substantially not contain any acyclic carbonate esters, it is possible to improve the storage stability.

The surface treatment composition does not contain any catalysts, but may be configured to contain a catalyst in a content of 2% by mass or less in 100% by mass of the surface treatment composition. The catalyst is a component that promotes a reaction between the wafer surface and the above-described trialkylsilylamine.

Examples of the catalyst include trimethylsilyltrifluoroacetate, trimethylsilyltrifluoromethanesulfonate, dimethylsilyltrifluoroacetate, dimethylsilyltrifluoromethanesulfonate, butyldimethylsilyltrifluoroacetate, butyldimethylsilyltrifluoromethanesulfonate, hexyldimethylsilyltrifluoroacetate, hexyldimethylsilyl trifluoromethanesulfonate, octyldimethylsilyltrifluoroacetate, octyldimethylsilyltrifluoromethanesulfonate, decyldimethylsilyltrifluoroacetate, decyldimethylsilyltrifluoromethanesulfonate, sulfonic acid, anhydrides of the sulfonic acid, salts of the sulfonic acid, sulfonic acid derivatives, sulfonic acid esters, sulfonimides, sulfonimide derivatives, sulfone methides, sulfone methide derivatives, acid imides, nitrogen-containing heterocyclic compounds, and silylated heterocyclic compounds.

When the surface treatment composition is made to substantially not contain any catalysts, it is possible to improve the storage stability.

The surface treatment composition of the present embodiment is obtained by mixing the individual components described above.

The obtained liquid mixture may be purified using an adsorbent, a filter, or the like as necessary. In addition, each component may be purified in advance by distillation or may be purified using an adsorbent, filter, or the like.

The surface treatment composition is configured such that the water contact angle on the silicon wafer surface after a surface treatment, which is measured by the following procedure, becomes, for example, 70° or more. This makes it possible to make the surface modification capability favorable.

(Procedure)

A silicon wafer having a thermal oxide film layer on a surface is immersed in 1% by mass of hydrofluoric acid at 25° C. for 10 minutes and cleaned by being immersed in pure water at 25° C. for 1 minute and in 2-propanol (iPA) at 25° C. for 1 minute.

The cleaned silicon wafer is disposed horizontally with a puddle of iPA formed thereon, and the vapor of the surface treatment composition is supplied to the silicon wafer.

Subsequently, the state of the vapor is changed to a liquid on the surface of the silicon wafer to replace iPA held on the surface with the liquid.

Subsequently, the silicon wafer is immersed in iPA at 25° C. for 1 minute.

After that, an air is blown to the silicon wafer to remove iPA on the surface.

The above-described water contact angle on the surface of the silicon wafer obtained by the above-described steps is measured in accordance with JIS R 3257: 1999 "Testing method of wettability of substrate glass surface" using approximately 2 μl of pure water.

The surface treatment composition is configured such that the number of particles larger than 0.2 μm, which is measured using a light scattering liquid borne particle detector, is, for example, $1.0 \times 10^4$ or less, preferably $1.0 \times 10^3$ or less, and more preferably $1.0 \times 10^2$ or less per 1 mL of the surface treatment composition. In such a case, it is possible to suppress a concern of a decrease in the yield and deterioration of the reliability of devices caused by the contamination of the inside of vapor treatment devices, vaporization chambers for vaporizing the surface treatment composition, other liquid-feeding units and the like.

On the other hand, the number of the particles larger than 0.2 μm is preferably as small as possible, but may be 1 or more per 1 mL of the composition as long as the content thereof is within the above-described range.

Particle measurement in a liquid phase in the surface treatment composition is measured using a commercially available measuring instrument in a light scattering type liquid borne particle measurement method where a laser is used as a light source, and the particle sizes of the particles mean the polystyrene latex (PSL) standard particle-based light scattering equivalent diameters.

Particles are particles of dust, dirt, an organic solid matter, an inorganic solid matter, or the like that is contained as an impurity in a raw material, particles of dust, dirt, an organic solid matter, an inorganic solid matter, or the like that is brought in as a contaminant during the preparation of the composition, or the like and are particles present in the end without being dissolved in the composition.

The surface treatment composition is configured such that the total content of Na, Mg, Ca, Mn, Fe, Cu, Li, Al, Cr, Ni, Zn, and Ag, which is measured using inductively coupled plasma mass spectrometry, in the treatment composition becomes, for example, 100 mass ppb or less, preferably 10 mass ppb or less, and more preferably 1 mass ppb or less. In such a case, it is possible to suppress a concern of a decrease in the yield and deterioration of the reliability of devices caused by the contamination of the inside of vapor treatment devices.

On the other hand, as long as the total content is within the above-described range, the content of each element may be 0.0001 mass ppb or more with respect to the total amount of the composition.

Hereinafter, a method for producing a wafer using the surface treatment composition will be described.

The method for producing a wafer according to the present embodiment includes a step of preparing a wafer having an uneven pattern on the surface, a step of cleaning the surface of the wafer by supplying a cleaning liquid, and a step of supplying the vapor of the surface treatment composition to the surface on which the cleaning liquid is held, changing, on the surface, the state of the vapor to a liquid to replace the cleaning liquid with the liquid, and forming a water-repellent protective film on at least a part of the surface.

In addition to the above-described steps, one or more of a pre-rinsing (first rinsing) step, a post-rinsing (second rinsing) step, a drying step, a water-repellent protective film removal step, and the like may be performed.

As the surface treatment composition that is used in the method for producing a wafer of the present embodiment, the same surface treatment composition as described above can be used.

FIGS. 1 to 4 show an example of steps of producing a wafer using a surface treatment composition.

FIG. 1 is a schematic perspective view of a wafer 1 having a fine uneven pattern 2 on a surface. FIG. 2 is a schematic cross-sectional view of the wafer 1 showing a part of an a-a' cross section in FIG. 1. FIG. 3 is a view showing a step of supplying a vapor 9 of a composition to recesses 4 holding a liquid 8. FIG. 4 is a view showing a step of cleaning the recesses 4 on which a water-repellent protective film 11 is formed of the composition with a liquid 10.

First, the wafer 1 having an uneven pattern on the surface is prepared.

In the preparation step of the wafer 1, the following method, which is an example of a method for forming the uneven pattern 2 on the wafer surface, may be used.

First, a resist is applied to the wafer surface, then, the resist is exposed through a resist mask, and the exposed or unexposed resist is removed, thereby producing a resist having a desired uneven pattern. In addition, a resist having an uneven pattern can also be obtained by pressing a mold having a pattern against the resist. Next, the wafer is etched. At this time, the substrate surface corresponding to the recess portions of the resist pattern is selectively etched. Finally, when the resist is peeled off, the wafer 1 having the uneven pattern 2 on the surface is obtained.

Materials of the wafer having the uneven pattern 2 formed thereon and the uneven pattern 2 are not particularly limited. As the material of the wafer 1, a variety of wafers such as a silicon wafer, a silicon carbide wafer, a wafer composed of a plurality of components containing a silicon atom, a sapphire wafer, and a variety of compound semiconductor wafers can be used.

As the material of the uneven pattern 2, one or more selected from the group consisting of Si, Ti, Ge, W, and Ru, oxides, nitrides, nitrogen oxides, carbonitrides, and carbide oxides each containing one or more of these elements may be contained. For example, as the material of the uneven pattern 2, it is possible to use silicon-based materials such as silicon oxide, silicon nitride, polycrystalline silicon, single-crystal silicon, and silicon germanium, metal-based materials such as titanium nitride, tungsten, ruthenium, tantalum nitride, and tin; materials obtained by combining the above-described materials, resist (photoresist) materials, and the like.

The uneven pattern 2 may be configured to be, for example, a three-dimensional structure in which one or more structures disposed along the vertical direction with respect to the surface and/or one or more structures disposed along the horizontal direction orthogonal to the vertical direction are provided. As an example of such a three-dimensional structure, at least a part of a logic device or memory device may be configured, and examples thereof include FinFET, nanowire FET, nanosheet FET, other multi-gate FET, three-dimensional memory cells, and the like.

FIG. 2 is a cross-sectional view showing an example of the uneven pattern 2.

In the present embodiment, the pattern dimension of the uneven pattern 2 can be defined as at least one dimension in the width direction in the in-plane direction of the surface and/or at least one dimension in the height direction in the vertical direction with respect to the surface.

The pattern dimension of at least one of the width and height of the cross-sectional structure (in the substrate thickness direction) in the pattern of the uneven pattern 2 or the pattern dimension of at least one of the width (length in the X-axis direction), height (length in the Y-axis direction), and depth (length in the Z-axis direction) in the three-dimensional structure (three-dimensional coordinates of XYZ) in the pattern of the uneven pattern 2 may be, for example, 30 nm or less, 20 nm or less, or 10 nm or less. This may be a spacing between the patterns. Even in the case of using the wafer 1 having such a fine uneven pattern 2, the surface treatment composition of the present embodiment can be applied.

Such a surface treatment composition is suitable for a surface treatment of, for example, the wafer 1 having the uneven pattern 2 in which the pattern dimension is 30 nm or less and preferably 20 nm or less.

The aspect ratio of a projection 3 may be, for example, 3 or more, 5 or more, or 10 or more. Pattern collapse can be suppressed even in the uneven pattern 2 having the projections 3 with a fragile structure.

On the other hand, the aspect ratio of the projection 3 is not particularly limited, but may be 100 or less.

The aspect ratio of the projection 3 is represented by a value obtained by dividing a height 6 of the projection by a width 7 of the projection.

In addition, a width 5 of the recess may be, for example, 70 nm or less and preferably 45 nm or less.

The width 5 of the recess is indicated by the spacing between a projection 3 and a projection 3 adjacent to each other in the cross-sectional view of FIG. 2.

Subsequently, the surface of the wafer 1 is cleaned with a cleaning liquid.

In the cleaning step, the surface of the wafer 1 may be brought into contact with an aqueous cleaning liquid, which is one cleaning liquid.

Examples of the aqueous cleaning liquid include water, alcohols, ammonium hydroxide aqueous solutions, tetramethylammonium aqueous solutions, hydrofluoric acid aqueous solutions, hydrochloric acid aqueous solutions, hydrogen peroxide aqueous solutions, sulfuric acid aqueous solutions, organic solvents, and the like. These may be used singly or two or more aqueous cleaning liquids may be used in combination.

The cleaning step may be performed once or more before a surface treatment step or before the first rinsing step. Other steps may be included between a plurality of cleaning steps or between the cleaning step and the surface treatment step.

Subsequently, the surface of the wafer 1 may be brought into contact with a first rinse solution (first rinsing step) as necessary.

As the first rinse solution, a cleaning liquid different from the aqueous cleaning liquid can be used, and examples thereof include water, an organic solvent, a mixture thereof, a substance obtained by mixing at least one of an acid, an alkali, a surfactant, and an oxidizing agent with water, the organic solvent or the mixture, and the like.

Examples of the organic solvent that is used as the first rinse solution include hydrocarbons, esters, ethers, ketones, halogen element-containing solvents, sulfoxide-based solvents, alcohols, polyhydric alcohol derivatives, nitrogen element-containing solvents, and the like. Among these, at least one selected from alcohols having 3 or less carbon atoms such as methanol, 1-propanol, and 2-propanol (isopropanol) is preferably used as the organic solvent.

In addition, a plurality of solutions may be used as the first rinse solution. For example, it is possible to perform rinsing with a solution containing an acid aqueous solution or an alkaline aqueous solution and an organic solvent in order. In addition, an aqueous cleaning liquid may be further added, and rinsing may be performed with the solution containing an acid aqueous solution or an alkaline aqueous solution, the aqueous cleaning liquid, and the organic solvent in order.

The first rinsing step may be performed once or more after the cleaning step or before the surface treatment step. Other steps may be included between a plurality of first rinsing steps or between the first rinsing step and the surface treatment step.

As a method for supplying the cleaning liquid, it is possible to use a well-known method, and examples thereof include a single wafer method represented by a cleaning method in which a spin cleaning device is used; in the spin cleaning device, the wafers are cleaned one by one by supplying a cleaning liquid to near the rotation center while almost horizontally holding and rotating the wafer, and a batch method in which a cleaning device is used; in the cleaning device, a plurality of wafers is immersed and cleaned in a cleaning tank.

This makes it possible to hold the cleaning liquid in at least the recesses 4 of the uneven pattern 2 of the wafer 1.

Subsequently, in a state in which the cleaning liquid (liquid 8) is held in at least the recesses 4 of the uneven pattern 2, a vapor 9 of the surface treatment composition of the present embodiment is supplied to the uneven pattern surface, the state of the vapor 9 is changed to a liquid 10 on the wafer surface, and at least the liquid 8 held in the recesses 4 is replaced with the liquid 10 and held, thereby forming a water-repellent protective film (protective film 11) on at least a part of the wafer surface, for example, the surfaces of the recesses 4.

When the vapor 9 of the surface treatment composition is supplied, the cleaning liquid (liquid 8) that is held on the wafer surface may be the above-described aqueous cleaning liquid or the first rinse solution and is preferably the first rinse solution from the viewpoint of producing stability, and, particularly, 2-propanol (IPA) may be contained. That is, as one aspect of the method for producing a wafer, the vapor 9 of the surface treatment composition may be supplied in a state in which IPA is held on the surface of the wafer.

In addition, the method for producing a wafer may include a step of preparing a surface treatment composition using a raw material having a total amount of moisture in the raw material of, for example, 2000 mass ppm or less, preferably 500 mass ppm or less, more preferably 100 mass ppm or less and still more preferably 50 mass ppm or less. This makes it possible to suppress deterioration of the surface modification capability in the surface treatment composition.

Examples of a method for supplying the vapor 9 of the surface treatment composition include a method in which the wafer 1 holding the liquid 8 in at least the recesses 4 of the uneven pattern 2 is disposed in a chamber, and, separately, a vapor obtained by evaporating the surface treatment composition is supplied to the uneven pattern surface through a pipe or a nozzle and the like. Upon the supply of the vapor, a carrier gas such as a nitrogen gas or a dry air may be used.

A method for vaporizing the surface treatment composition is not particularly limited to the above-described method.

Examples thereof include a batch-type vaporization method in which a predetermined amount of the surface treatment composition in a liquid state is introduced into a vaporization chamber, heated sufficiently enough to evaporate the full amount of the surface treatment composition, once the full amount of the surface treatment composition has been evaporated, the vapor 9 is sent out to a pipe or nozzle to be supplied to the uneven pattern surface.

In addition, examples thereof include a continuous vaporization method in which droplets of the surface treatment composition are dropped into a preheated small-scale vaporization unit (for example, heating unit provided in a part of a pipe or the like) and the vapor 9 is sent out to a pipe or a nozzle to be supplied to the uneven pattern surface in a manner that the full amount of the surface treatment composition is evaporated each dropping.

The vaporization temperature is preferably suppressed at a temperature where there is no concern of thermal decomposition of the silylating agent, which is a protective film-forming component. Conditions for a preferable vapor treatment are as follows: a nitrogen gas is introduced, and a gas mixture of the vapor obtained as described above and the nitrogen gas is supplied to the uneven pattern surface after the composition of the gas mixture becomes constant.

The temperature of the atmosphere near the substrate in the middle of the treatment, that is, the temperature of the vapor, is preferably lower than the boiling point of the liquid 8 held in the recesses 4. When these conditions are satisfied, it is possible to prevent the volatilization of the liquid 8 held in the recesses before the liquid 8 is replaced with the surface treatment composition, and thus it becomes easy to suppress the pattern collapse of the uneven pattern 2.

FIG. 3 shows a schematic view of a state in which the vapor 9 is supplied to the recesses 4 holding the liquid 8. FIG. 4 shows a schematic view of a step of the recesses 4 on which the water-repellent protective film 11 is formed of the surface treatment composition. The wafer 1 in the schematic views of FIG. 3 and FIG. 4 shows a part of an a-a' cross section in FIG. 1.

As shown in FIGS. 3 and 4, the state of the supplied vapor 9 is changed to the liquid 10 in the recesses 4, the liquid 8 held in the recesses 4 is replaced with the liquid 10, and the liquid 10 is held in the recesses 4. In addition, for the purpose of promoting or stabilizing the above-described state change, the temperature may be adjusted so that the temperature of the wafer 1 or the recesses 4 becomes low or constant.

On the wafer surface, the silylating agent in the liquid 10 reacts with the wafer surface, and a portion having a water-repellent functional group is fixed to the wafer surface, whereby a water-repellent protective film (protective film 11) is formed.

The protective film 11 may not be continuously formed at all times and may not be uniformly formed at all times, but it is more preferable that the protective film is continuously and uniformly formed since it is possible to impart superior water repellency.

When the liquid 8 held on the wafer surface such as the first rinse solution or the aqueous cleaning liquid is replaced with the liquid 10 obtained by liquefying the vapor 9 of the surface treatment composition, it becomes possible to perform a surface modification treatment, that is, to form the protective film 11 before the surface of the uneven pattern 2 on the surface of the wafer 1 gets into a dry state. This makes it possible to suppress the pattern collapse of the uneven pattern 2.

The formation of the protective film 11 may be promoted by applying a well-known treatment such as a heating treatment, a decompression treatment or a drying treatment to the liquid 10 held on the wafer surface as necessary.

Subsequently, the wafer surface on which the protective film 11 has been formed may be brought into contact with a second rinse solution as necessary (second rinsing step).

As the second rinse solution, those exemplified as the first rinse solution can be used.

In addition, a plurality of solutions may be used as the second rinse solution. For example, rinsing can be performed by bringing the wafer surface into contact with water and an organic solvent such as isopropanol in this order.

The second rinsing step may be performed once or more after the surface treatment step. Other steps may be included between a plurality of second rinsing steps or between the second rinsing step and the surface treatment step.

Subsequently, after the formation of the protective film 11, a drying step of drying the surface of the wafer 1 may be performed as necessary.

The drying step makes it possible to remove liquid present on the surface of the wafer 1.

The liquid may include the liquid 10, the second rinse solution, or a liquid mixture thereof.

As a drying method, for example, a well-known method such as a spin drying method, 2-propanol (IPA) vapor drying, marangoni drying, heat drying, hot air drying, vacuum drying, or drying under reduced pressure may be used.

The drying step may be performed once or more and may be performed, for example, after the surface treatment step or after the second rinsing step. The drying step and the second rinsing step may be alternately repeated.

Subsequently, the protective film 11 on the surface of the wafer 1 may be removed (removal step).

Examples of a removal method include heating, UV irradiation, ozone exposure, plasma irradiation, corona discharge, and the like. In addition, a treatment with a concentrated fluid such as a supercritical fluid (which may contain an acid, abase, or an oxidizing agent) or, additionally, a treatment for removing the protective film using a gas-phase removing agent may also be performed. These may be used singly or two or more methods may be used in combination. These treatments may be performed under the atmospheric pressure or reduced pressure.

The wafer 1 (semiconductor substrate) for which the surface treatment composition of the present embodiment is used can be obtained as described above.

The producing method shown in FIG. 3 is intended for wafer patterns, but the present invention is not limited thereto. The method for producing a wafer of the present embodiment can be intended for resist patterns and is also capable of suppressing the collapse of resist patterns using the surface treatment composition of the present invention in the cleaning and drying steps of resist patterns.

The supply step is performed after the cleaning step in the producing method described above, but the supply step is not limited thereto and may be performed after a variety of treatments that are performed on the uneven pattern 2.

In the method for producing a wafer, in addition to the above-described steps, one or more well-known treatments may be used in combination. For example, a surface treatment such as a plasma treatment may be performed after the above-described removal step.

Hitherto, the embodiment of the present invention has been described, but the embodiment is an example of the present invention, and it is possible to adopt a variety of configurations other than the above-described configuration. In addition, the present invention is not limited to the above-described embodiment, and modifications, improvements, and the like are included in the present invention as long as the object of the present invention can be achieved.

Hereinafter, examples of reference forms will be added.

1. A surface treatment composition that are supplied as a vapor to a surface of a wafer having an uneven pattern on the surface and used to form a water-repellent protective film on the surface, the surface treatment composition containing a silylating agent and a solvent, in which the silylating agent contains a trialkylsilylamine, and the solvent contains 50% by mass or more of glycol ether acetate in 100% by mass of a total amount of the solvent.

2. The surface treatment composition according to 1., in which a content of the silylating agent is 0.3% by mass or more and 30% by mass or less in 100% by mass of the surface treatment composition.

3. The surface treatment composition according to 1. or 2., in which a content of the glycol ether acetate is 50% by mass or more in 100% by mass of the surface treatment composition.

4. The surface treatment composition according to any one of 1. to 3., in which a boiling point difference between a boiling point of the solvent and a boiling point of the silylating agent at 1 atm (the boiling point of the solvent—the boiling point of the silylating agent) is 20° C. or more.

5. The surface treatment composition according to any one of 1. to 4., in which the trialkylsilylamine includes one or more selected from the group consisting of trimethylsilyldimethylamine, trimethylsilyldiethylamine, and N-(trimethylsilyl)-tertiary-butylamine.

6. The surface treatment composition according to any one of 1. to 5., in which a water contact angle on a silicon wafer surface after a surface treatment, which is measured by the following procedure, is 70° or more.

(Procedure)

A silicon wafer having a thermal oxide film layer on a surface is immersed in 1% by mass of a hydrofluoric acid aqueous solution at 25° C. for 10 minutes and cleaned by being immersed in pure water at 25° C. for 1 minute and in 2-propanol (iPA) at 25° C. for 1 minute.

The cleaned silicon wafer is disposed horizontally with a puddle of iPA formed thereon, and a vapor of the surface treatment composition is supplied to the silicon wafer.

Subsequently, a state of the vapor is changed to a liquid on the surface of the silicon wafer to replace iPA held on the surface with the liquid.

Subsequently, the silicon wafer is immersed in iPA at 25° C. for 1 minute.

After that, an air is blown to the silicon wafer to remove iPA on the surface.

The above-described water contact angle on the surface of the silicon wafer obtained by the above-described steps is measured in accordance with JIS R 3257: 1999 "Testing method of wettability of substrate glass surface" using approximately 2 μl of pure water.

7. The surface treatment composition according to any one of 1. to 6., in which the surface treatment composition does not contain a fluorine-based solvent.

8. The surface treatment composition according to any one of 1. to 7., in which the surface treatment composition does not contain an acyclic carbonate ester.

9. The surface treatment composition according to any one of 1. to 8., in which the surface treatment composition does not contain a catalyst.

10. The surface treatment composition according to any one of 1. to 9., in which the number of particles larger than 0.2 μm, which is measured using a light scattering liquid borne particle detector, is $1.0 \times 10^4$ or less per 1 mL of the surface treatment composition.

11. The surface treatment composition according to any one of 1. to 10., in which a total content of Na, Mg, Ca, Mn, Fe, Cu, Li, Al, Cr, Ni, Zn, and Ag, which is measured using inductively coupled plasma mass spectrometry, is 100 mass ppb or less in the surface treatment composition.

12. A method for producing a wafer, including:

a step of preparing a wafer having an uneven pattern on a surface, a step of cleaning the surface of the wafer by supplying a cleaning liquid, and a step of supplying a vapor of a surface treatment composition to the surface on which the cleaning liquid is held, changing, on the surface, a state of the vapor to a liquid to replace the cleaning liquid with the liquid, and forming a water-repellent protective film on at least a part of the surface, in which the surface treatment composition contains a silylating agent and a solvent, the silylating agent contains a trialkylsilylamine, and the solvent contains 50% by mass or more of glycol ether acetate in 100% by mass of a total amount of the solvent.

13. The method for producing a wafer according to 12., in which the vapor of the surface treatment composition is supplied in a state in which IPA is held on the surface of the wafer.

14. The method for producing a wafer according to 12. or 13., further including:

a step of preparing the surface treatment composition using a raw material having 2,000 mass ppm or less of a total amount of moisture in the raw material with respect to a total amount of the raw material.

EXAMPLES

Hereinafter, examples disclosing an embodiment of the present invention more specifically will be described. The present invention is not limited only to these examples.

Example 1

(Preparation of Surface Treatment Composition)

Trimethylsilyldimethylamine [$(CH_3)_3Si$—$N(CH_3)_2$] (hereinafter, abbreviated as "TMSDMA") as a silylating agent; 5 g and propylene glycol monomethyl ether acetate (hereinafter, abbreviated as "PGMEA") as a solvent; 95 g were mixed to obtain a surface treatment composition (hereinafter, abbreviated as "composition").

The composition immediately after preparation was evaluated by operations described in the following (A) and (B), and the results are shown in Table 1.

[Evaluation Methods]

(A) Evaluation of Storage Stability of Composition

The raw materials of the composition were mixed together, and then the appearance of the composition was visually observed after being placed still at 45° C. In a case where precipitation or deposition of an insoluble matter did not occur after 1 week, the composition was evaluated as "⊚", in a case where precipitation or deposition of an insoluble matter did not occur after being placed still for 1 day, but precipitation or deposition of an insoluble matter occurred after 1 week, the composition was evaluated as "o", and, in a case where precipitation or deposition of an insoluble matter did not occur after being placed still for 4 hours, but precipitation or deposition of an insoluble matter occurred after being placed still for 1 day, the composition was evaluated as "Δ". In addition, the raw materials of the composition were mixed together and placed still at 45° C., and precipitation or deposition of an insoluble matter occurred within 4 hours, the composition was evaluated as "x".

In addition, the composition was analyzed by gas chromatography, and a change in the concentration of the silylating agent during storage was confirmed. For the analysis, a gas chromatography device (GC-2010 Plus manufactured by Shimadzu Corporation) to which a capillary column TC-1 (manufactured by GL Sciences Inc.) was attached was used.

Measurement was performed on a sample immediately after preparation and a sample that had been stored at 45° C. for 1 day from preparation. For each composition, the reduction percentage (%) of the concentration of the silylating agent when the initial concentration of a contrast sample was regarded as 100% was calculated from the ratio between the area % of the silylating agent in the chromatography chart of the contrast sample immediately after preparation and the area % of the silylating agent in the chromatography chart after storage.

(B) Evaluation of Surface Modification Capability of Composition (Evaluation of Contact Angle of Water-Repellent Protective Film Formed on Wafer Surface)

Provision of an uneven pattern on the surface of a wafer and replacement of a cleaning liquid held in at least recesses of the uneven pattern with another cleaning liquid were studied in a variety of manners in other publications and are techniques that are already established. In the present invention, a water repellency-imparting effect when a wafer was surface-treated with the vapor of the composition was evaluated.

In the case of a wafer having an uneven pattern on the surface, it is not possible to accurately evaluate the contact angle of the protective film 11 (water-repellent protective film) itself formed on the uneven pattern surface.

The contact angle of a water droplet is evaluated by dropping several microliters of water droplets on the surface of a sample (substrate) and measuring an angle formed between the water droplet and the base material surface as described in JIS R 3257: 1999 "Testing method of wettability of substrate glass surface". However, in the case of a patterned wafer, the contact angle of a water droplet becomes extremely large. This is because the Wenzel effect or the Cassie effect occurs, the contact angle is affected by the surface shape (roughness) of the base material, and the apparent contact angle of a water droplet increases.

Therefore, in the present example, a protective film was formed on the wafer surface by supplying the vapor of the composition to a wafer having a smooth surface, this protective film was regarded as a protective film formed on the surface of a wafer having an uneven pattern formed on the surface, and evaluation was performed by the following procedure. In the present example, a thermal oxide film-attached silicon wafer having a SiO$_2$ layer on a silicon wafer with a smooth surface was used as the wafer having a smooth surface.

(1) Cleaning of Silicon Wafer

A smooth thermal oxide film-attached silicon wafer (a Si wafer having a 1 μm-thick thermal oxide film layer on the surface) was immersed in 1% by mass of a hydrofluoric acid aqueous solution at 25° C. for 10 minutes, immersed in pure water at 25° C. for 1 minute, and subsequently immersed in 2-propanol (hereinafter, abbreviated as iPA) at 25° C. for 1 minute.

contact angle) was measured with a contact angle meter (manufactured by Kyowa Interface Science Co., Ltd.: CA-X type) in accordance with JIS R 3257: 1999 "Wettability test method for substrate glass surface". In addition, a total of 3 samples were produced from the wafer on which the protective film was formed, and the water contact angle was measured from each sample. In Table 1, the difference between the maximum value and the minimum value of the water contact angles in the 3 samples was entered as the variation in the water contact angle.

The water contact angle on the surface of a silicon wafer having no protective film formed on the surface, which was obtained by performing the treatments (1) and (3) without performing the (2), was less than 10°.

TABLE 1

| | Composition | | | (A) Storage stability | | (B) Surface modification capability |
| | Silylating agent | Solvent | Content of silylating agent in total amount of composition [% by mass] | Appearance | Amount of silylating agent reduced during storage [%] | Variation in water contact angle [°] |
| --- | --- | --- | --- | --- | --- | --- |
| Example 1 | TMSDMA | PGMEA | 5 | ⊚ | <0.5 | 0.5 |
| Example 2 | TMSDMA | PGMEA | 7 | ⊚ | <0.5 | 0.9 |
| Example 3 | TMSDMA | PGMEA | 9 | ⊚ | <0.5 | 0.3 |
| Example 4 | TMSDMA | PGMEA | 11 | ⊚ | <0.5 | 0.7 |
| Example 5 | TMSDMA | PGMEA | 13 | ⊚ | <0.5 | 0.7 |
| Example 6 | TMSDMA | PGMEA | 3 | ⊚ | <0.5 | 0.7 |
| Example 7 | PDMSDMA | PGMEA | 11 | ⊚ | <0.5 | 0.6 |
| Example 8 | BDMSDMA | PGMEA | 11 | ⊚ | <0.5 | 0.8 |
| Comparative Example 1 | TMSDMA | Diethyl carbonate, propylene carbonate | 5 | Δ | 1.1 | 1.7 |

(2) Surface Treatment of Silicon Wafer Surface with Vapor

The cleaned silicon wafer was disposed horizontally in a vapor treatment chamber with a puddle of iPA formed thereon, and the composition in a solution state prepared above was vaporized under the following vapor supply conditions, and the vapor was supplied to the vapor treatment chamber.

In addition, the state of the vapor supplied to the wafer surface of 50° C. or less was changed to a liquid, and the iPA held on the wafer surface was replaced with the liquid.

Conditions for supplying vapor of composition: As a result of dropping the composition in a solution state prepared above at a dropping rate of 0.01 g/second while a nitrogen gas was made to flow into a vaporization chamber heated to 145° C. at a flow rate of 2 dm$^3$/minute, the full amount of the dropped composition was vaporized. The vapor was immediately fed into the vapor treatment chamber with a nitrogen gas flow. The treatment was performed for 60 seconds.

(3) Cleaning of Silicon Wafer

After that, the silicon wafer was taken out from the vapor treatment chamber and immersed in iPA at 25° C. for 1 minute. In the end, the silicon wafer was taken out from iPa, and an air was blown to remove iPA on the surface.

A silicon wafer having a protective film formed on the surface was obtained as described above.

(4) Measurement of Water Contact Angle of Protective Film

Approximately 2 μl of pure water was placed on the wafer surface on which the protective film was formed, and the angle between the water droplet and the wafer surface (water Example 2

A composition was prepared in the same manner as in Example 1 except that TMSDMA as a silylating agent; 7 g and PGMEA as a solvent: 93 g were mixed to obtain the composition, a variety of evaluations were performed, and the results were shown in Table 1.

Example 3

A composition was prepared in the same manner as in Example 1 except that TMSDMA as a silylating agent; 9 g and PGMEA as a solvent: 91 g were mixed to obtain the composition, a variety of evaluations were performed, and the results were shown in Table 1.

Example 4

A composition was prepared in the same manner as in Example 1 except that TMSDMA as a silylating agent; 11 g and PGMEA as a solvent: 89 g were mixed to obtain the composition, a variety of evaluations were performed, and the results were shown in Table 1.

Example 5

A composition was prepared in the same manner as in Example 1 except that TMSDMA as a silylating agent; 13 g and PGMEA as a solvent: 87 g were mixed to obtain the composition, a variety of evaluations were performed, and the results were shown in Table 1.

Example 6

A composition was prepared in the same manner as in Example 1 except that TMSDMA as a silylating agent; 3 g and PGMEA as a solvent: 97 g were mixed to obtain the composition, a variety of evaluations were performed, and the results were shown in Table 1.

Example 7

A composition was prepared in the same manner as in Example 1 except that propyldimethylsilyldimethylamine [(CH₃CH₂CH₂)(CH₃)₂Si—N(CH₃)₂] (hereinafter, abbreviated as "PDMSDMA") as a silylating agent; 11 g and PGMEA as a solvent: 89 g were mixed to obtain the composition, a variety of evaluations were performed, and the results were shown in Table 1.

Example 8

A composition was prepared in the same manner as in Example 1 except that butyldimethylsilyldimethylamine [(CH₃CH₂CH₂CH₂)(CH₃)₂Si—N(CH₃)₂] (hereinafter, abbreviated as "BDMSDMA") as a silylating agent; 11 g and PGMEA as a solvent: 89 g were mixed to obtain the composition, a variety of evaluations were performed, and the results were shown in Table 1.

Comparative Example 1

A composition was prepared in the same manner as in Example 1 except that TMSDMA as a silylating agent; 5 g and, as a solvent, propylene carbonate: 45 g and diethyl carbonate; 50 g were mixed to obtain the composition, a variety of evaluations were performed, and the results were shown in Table 1.

The surface treatment compositions of Examples 1 to 8 had a water contact angle of 70° or more and had favorable water repellency. In addition, as a result of repeatedly performing the water contact angle measurement of (4) a plurality of times using the compositions immediately after preparation, results of suppressed variation in the measurement values were shown. Such surface treatment compositions of Examples 1 to 8 could be used in the wafer producing process with no practical problems. On the other hand, in Comparative Example 1, the water contact angle was 70° or more, but a tendency of the variation to become larger than those in Examples 1 to 8 was shown. That is, Examples 1 to 8 showed more favorable surface modification capability than Comparative Example 1 in that both favorable water repellency and suppression of the variations in the water contact angle were satisfied.

In addition, as a result of performing the evaluation of the storage stability of the composition of (A), the surface treatment compositions of Examples 1 to 8 showed the results that the occurrence of precipitation was suppressed in the composition and a change in the concentration of the silylating agent in the composition was small compared with Comparative Example 1. The surface treatment compositions of Examples 1 to 8 showed the results that the concentration of the silylating agent rarely changed from immediately after preparation to 1 month later, but the surface treatment composition of Comparative Example 1 showed the result that the concentration of the silylating agent decreased over time as a result of measurements after 6 hours from immediately after preparation and after 4 days. As described above, the surface treatment compositions of Examples 1 to 8 showed the results that the storage stability was excellent compared with Comparative Example 1.

This application claims priority on the basis of Japanese Patent Application No. 2021-029887 filed on Feb. 26, 2021, the entire disclosure of which is incorporated herein by reference.

REFERENCE SIGNS LIST

1 Wafer
2 Uneven pattern
3 Projection
4 Recess
5 Width of recess
6 Height of projection
7 Width of projection
8 Liquid
9 Vapor
10 Liquid
11 Protective film

The invention claimed is:

1. A surface treatment composition that are supplied as a vapor to a surface of a wafer having an uneven pattern on the surface and used to form a water-repellent protective film on the surface, the surface treatment composition comprising:

a silylating agent; and a solvent, wherein the silylating agent contains a trialkylsilylamine, the solvent contains at least one or more selected from the group consisting of glycol ether acetate and glycol acetate, and a total content of the glycol ether acetate and the glycol acetate is 50% by mass or more in 100% by mass of a total amount of the solvent.

2. The surface treatment composition according to claim 1, wherein a content of the silylating agent is 0.3% by mass or more and 30% by mass or less in 100% by mass of the surface treatment composition.

3. The surface treatment composition according to claim 1, wherein a total content of the glycol ether acetate and the glycol acetate is 50% by mass or more in 100% by mass of the surface treatment composition.

4. The surface treatment composition according to claim 1, wherein a boiling point difference between a boiling point of the solvent and a boiling point of the silylating agent at 1 atm (the boiling point of the solvent–the boiling point of the silylating agent) is 20° C. or more.

5. The surface treatment composition according to any one of claims claim 1, wherein the trialkylsilylamine includes one or more selected from the group consisting of trimethylsilyldimethylamine, trimethylsilyldiethylamine, and N-(trimethylsilyl)-tertiary-butylamine.

6. The surface treatment composition according to any one of claims claim 1, wherein a water contact angle on a silicon wafer surface after a surface treatment, which is measured by the following procedure, is 70° or more, (the procedure)

a silicon wafer having a thermal oxide film layer over a surface is immersed in 1% by mass of hydrofluoric acid at 25° C. for 10 minutes and cleaned by being immersed in pure water at 25° C. for 1 minute and in 2-propanol (iPA) at 25° C. for 1 minute, the cleaned silicon wafer is disposed horizontally in a state in which a puddle of iPA is formed on the silicon wafer, and a vapor of the surface treatment composition is supplied to the silicon wafer, subsequently, a state of the vapor is changed, on the surface of the silicon wafer, to a liquid to replace iPA held on the surface with the liquid, subsequently, the silicon wafer is immersed in iPA at 25° C. for 1 minute, then, an air is blown to the silicon wafer to remove iPA on the surface, and the water contact angle on the surface of the silicon wafer obtained by the above-described steps is measured in accordance with JIS R 3257:1999 "Testing method of wettability of substrate glass surface" using approximately 2 μl of pure water.

7. The surface treatment composition according to claim 1, wherein the surface treatment composition does not contain a fluorine-based solvent, an acyclic carbonate ester and/or a catalyst.

8. The surface treatment composition according to claim 1, wherein the number of particles larger than 0.2 μm, which is measured using a light scattering liquid borne particle detector, is $1.0 \times 10^4$ or less per 1 mL of the surface treatment composition.

9. The surface treatment composition according to claim 1, wherein a total content of Na, Mg, Ca, Mn, Fe, Cu, Li, Al, Cr, Ni, Zn, and Ag, which is measured using inductively coupled plasma mass spectrometry, is 100 mass ppb or less in the surface treatment composition.

10. A method for producing a wafer, comprising:

a step of preparing a wafer having an uneven pattern on a surface;

a step of cleaning the surface of the wafer by supplying a cleaning liquid; and a step of supplying a vapor of a surface treatment composition to the surface on which the cleaning liquid is held, changing, on the surface, a state of the vapor to a liquid to replace the cleaning liquid with the liquid, and forming a water-repellent protective film on at least a part of the surface, wherein the surface treatment composition contains a silylating agent and a solvent, the silylating agent contains a trialkylsilylamine, the solvent contains at least one or more selected from the group consisting of glycol ether acetate and glycol acetate, and a total content of the glycol ether acetate and the glycol acetate is 50% by mass or more in 100% by mass of a total amount of the solvent.

11. The method for producing a wafer according to claim 10, wherein, in the surface treatment composition, a content of the silylating agent is 0.3% by mass or more and 30% by mass or less in 100% by mass of the surface treatment composition.

12. The method for producing a wafer according to claim 10, wherein, in the surface treatment composition, a total content of the glycol ether acetate and the glycol acetate is 50% by mass or more in 100% by mass of the surface treatment composition.

13. The method for producing a wafer according to claim 10, wherein, in the surface treatment composition, a boiling point difference between a boiling point of the solvent and a boiling point of the silylating agent at 1 atm (the boiling point of the solvent–the boiling point of the silylating agent) is 20° C. or more.

14. The method for producing a wafer according to claim 10, wherein, in the surface treatment composition, the trialkylsilylamine includes one or more selected from the group consisting of trimethylsilyldimethylamine, trimethylsilyldiethylamine, and N-(trimethylsilyl)-tertiary-butylamine.

15. The method for producing a wafer according to claim 10, wherein the surface treatment composition does not contain a fluorine-based solvent, an acyclic carbonate ester and/or a catalyst.

16. The method for producing a wafer according to claim 10, wherein, in the surface treatment composition, the number of particles larger than 0.2 μm, which is measured using a light scattering liquid borne particle detector, is $1.0 \times 10^4$ or less per 1 mL of the surface treatment composition.

17. The method for producing a wafer according to claim 10, wherein, in the surface treatment composition, a total content of Na, Mg, Ca, Mn, Fe, Cu, Li, Al, Cr, Ni, Zn, and Ag, which is measured using inductively coupled plasma mass spectrometry, is 100 mass ppb or less in the treatment composition.

18. The method for producing a wafer according to claim 10, wherein the vapor of the surface treatment composition is supplied in a state in which IPA is held on the surface of the wafer.

19. The method for producing a wafer according to claim 10, further comprising:

a step of preparing the surface treatment composition using a raw material having 2,000 mass ppm or less of a total amount of moisture in the raw material with respect to a total amount of the raw material.

* * * * *